United States Patent [19]

Rolandi

[11] Patent Number: 5,923,975
[45] Date of Patent: Jul. 13, 1999

[54] FABRICATION OF NATURAL TRANSISTORS IN A NONVOLATILE MEMORY PROCESS

[75] Inventor: Paolo Rolandi, Voghera, Italy

[73] Assignee: SGS-Thomson Microelectronics S.r.l., Agrate Brianza, Italy

[21] Appl. No.: 08/784,967

[22] Filed: Jan. 16, 1997

[30] Foreign Application Priority Data

Jan. 22, 1996 [EP] European Pat. Off. .............. 96830021

[51] Int. Cl.⁶ ............................................... H01L 21/8247
[52] U.S. Cl. .......................................... 438/258; 438/291
[58] Field of Search ................................... 438/257–267, 438/291

[56] References Cited

U.S. PATENT DOCUMENTS

| | | | |
|---|---|---|---|
| 4,766,088 | 8/1988 | Kono et al. | 437/52 |
| 5,480,821 | 1/1996 | Chang . | |
| 5,554,551 | 9/1996 | Hong . | |
| 5,656,527 | 8/1997 | Choi et al. | 438/258 |
| 5,789,293 | 8/1998 | Cho et al. | 438/257 |
| 5,789,294 | 8/1998 | Choi | 438/258 |

FOREIGN PATENT DOCUMENTS

| | | |
|---|---|---|
| 0395084 A3 | 10/1990 | European Pat. Off. . |
| 058312 A1 | 2/1994 | European Pat. Off. . |

Primary Examiner—Richard A. Booth
Attorney, Agent, or Firm—Allen, Dyer, Doppelt, Milbrath & Gilchrist, P.A.

[57] ABSTRACT

In a fabrication process of a nonvolatile memory device, natural or low threshold transistors usable in the peripheral circuitry are economically fabricated by exploiting the MATRIX mask that is commonly used for patterning the interpoly dielectric layer for defining the channel length of the natural transistors by patterning the interpoly dielectric layer also over the channel area of the natural transistor, outside the matrix area. The so predefined interpoly dielectric is thereafter exploited as a mask of the polysilicon of a first level during the patterning step of the polysilicon of a second level. Electrical continuity between the polysilicon of the second level and the so patterned gate of polysilicon of the first level are established over the field oxide adjacent to the active area of the natural transistor.

9 Claims, 3 Drawing Sheets

FABRICATION OF NATURAL TRANSISTORS IN A NONVOLATILE MEMORY PROCESS

FIELD OF THE INVENTION

The present invention relates to a process for fabricating integrated circuits comprising nonvolatile memory floating gate cells with a double level of polysilicon, wherein natural or low threshold integrated transistors are also fabricated.

BACKGROUND OF THE INVENTION

Fabrication processes of integrated structures comprising nonvolatile memory cells, that is, arrays of cells arranged in rows and columns, using a double level of polysilicon with a gate dielectric layer and an isolating interpoly dielectric layer between the two levels of polysilicon, are well known and widely used by the industry. Usually, such fabrication processes optionally use a first step of masking and of implantation to define "well" regions having a type of conductivity different than that of the semiconductor substrate, in order to realize n and p channel devices integrated on the same chip. In essence, well known processes, therefore, take advantage of a mask for defining the active areas of different integrated devices (transistors, floating gate memory cells, etc.). Normally the process utilizes a further masking step to realize field isolation implants, that is, to dope the semiconductor in the zones where is subsequently grown a thick oxide layer of definition and isolation of the distinct active areas.

The process may include an anti "punch-through" (APT) implant on all the active areas of the same type of conductivity. This relatively deep implant, that is performed with high energy implantation, also serves to determine a certain threshold, although of a minimum value, of the so-called natural transistors or better said of low threshold transistors that are eventually realized (in order to permit their substantial cut-off).

A relatively "heavy" implant for incrementing the threshold (EPM) is carried out within the so-called matrix area, where the floating gate memory cells are to be realized. Thereafter, over the active areas a thin layer of gate oxide is grown. After depositing and doping a first level polysilicon layer (POLY 1), a masking and etching step is commonly carried out for a first step of definition of the polysilicon of the first level, so as to define the floating gates of the memory cells. Therefore, over the entire structure is grown and/or deposited a thin dielectric layer of isolation between the two polysilicon levels. Such a thin isolating dielectric layer can be constituted by a multilayer, typically a first oxidation layer, plus a deposited thin layer of silicon nitride, and a third layer produced by thermal oxidation of the nitride layer This interpoly isolating multilayer is commonly called O.N.O.

At this point, it is peculiar to these fabrication processes to include a masking step using a mask commonly referred to as MATRIX mask, to remove the dielectric interpoly layer from all the surface, but the area occupied by the memory cells (MATRIX). This is followed by the deposition of a layer of doped polysilicon of the second level which, over the areas of the floating gate memory cells, will then be isolated by the dielectric layer from the patterned portions of the polysilicon of first level previously defined. Conversely, outside the area occupied by the matrix memory cells, that is on the areas in which the peripheral transistors and the other devices of the outer circuitry are realized, this second level doped polysilicon layer is directly laid over the existing portions of polysilicon layer of first level.

According to prior art processes, it may also be necessary to carry out a specific masking step in order to accomplish an implant of light voltage shift, known as LVS implant, in the channel areas of standard "enhancement" transistors of the outer circuitry, and while protecting from this LVS implant the channel area of the so-called "natural" or low threshold transistors.

A further masking and etching (POLY 2) step defines the polysilicon of second level. In the matrix area the etching through this (POLY 2) mask stops on the dielectric interpoly layer, while in the outer circuitry area the etching proceeds to define also the underlying polysilicon of the first level. In this way, the channel length of the outer circuitry transistors, including also eventual "natural" or low threshold transistors, is defined in accordance with what has been said regarding the ATP implant. A process of fabrication of this type is described in the Italian Patent Application No. 23737 A/84 and, among others, in the corresponding publication No. GB-2,167,602, both in the name of the present applicant. The pertinent content of these previous publications is herein incorporated by way of reference.

SUMMARY OF THE INVENTION

It has now been found a more efficient way of realizing also natural or low threshold transistors in fabrication process like the one mentioned above that in essence eliminates the need for the masking step of threshold adjustment, known as light voltage shift (LVS), in the transistors of the outer circuitry. This represents a significative reduction of the costs of fabrication without in any way decreasing the general performance characteristics of the integrated device.

According to the present invention, this important result is attained, by exploiting the same MATRIX mask used for etching the dielectric interpoly layer, adequately modified in such a way to define through such a modified MATRIX mask also the channel length of natural transistors outside the area occupied by the matrix of memory cells.

Therefore, according to another important aspect of the invention, masking of the channel area within the active area of a relative natural transistor to be realized outside the zone occupied by the memory cells matrix from the threshold adjustment implant that is usually performed in the channel area of the "enhancement" transistors of the outer circuitry as well as in the area of the so-called direct contacts between the polysilicon of second level and the semiconductor, etc. is advantageously provided by means of the MATRIX mask. According to the process of the invention, a natural transistor is therefore realized in a quite nonconventional manner if compared to the other transistors of normally "enhanced" threshold, starting from the MATRIX masking step of the fabrication process. Such a MATRIX mask, modified according to the invention, defines the channel length of the natural transistor by defining the zone where the isolating dielectric layer between the two superimposed layers of doped polycrystalline silicon remains.

The dielectric layer left over the surface of the doped polycrystalline silicon of first level is exploited during the subsequent phase of masking and defining the doped polycrystalline silicon layer of second level, as a mask during the selective etching of the polycrystalline silicon of first level in the areas unprotected by the masking dielectric layer purposely left on part of its surface by the etching carried out through the apertures of the MATRIX mask. In this way, the channel length of the natural transistor is defined by the MATRIX mask. This is made possible by ensuring that in the active area of the natural transistor and in the direction of the channel length, the POLY 2 definition mask be narrower than the width of the interpoly dielectric layer previously defined.

Over the area of the natural transistor area, the two defined layers of polycrystalline silicon are shortcircuited with each other over the field oxide adjacent to the sides of the active area of the transistor, orthogonal to the direction of the channel length. Therefore, the patterned polycrystalline silicon of second level electrically performs a simple interconnection function. To ensure such an interconnection, it is sufficient that the superimposition of the polysilicon of second level over the polysilicon of first level be greater than at least 0.5 mm, so as to obviate the misalignments tolerances between the two definition masks of the two polysilicon levels, namely: POLY 1 and POLY 2, respectively. Furthermore, the MATRIX mask is exploited also for masking the channel area of the natural transistor from the LVS implant, that may be carried out after etching the interpoly dielectric layer, prior to the removal of the MATRIX mask.

The eventual minor implantation of dopant that may occur through the thickness of the polysilicon layer of the first level and the gate oxide layer in the unmasked areas of the active area of the natural transistor will be compensated and inverted by the subsequent implantation and diffusion of the source and drain areas of the transistor. The process therefore continues with the definition step of the polysilicon of the second level by the mask POLY 2. Within the area of the natural transistor, the etching will stop over the interpoly dielectric layer, while it will continue across the polycrystalline silicon layer of first level beyond the masking edge of the interpoly dielectric layer, thus conclusively defining the transistor's channel, that is the length of the gate structure. Thereafter the fabrication process may continue in the usual way of known processes with the etching of the gate oxide, and the subsequent implantation and diffusion of the source and drain regions of the integrated devices.

BRIEF DESCRIPTION OF THE DRAWINGS

The different aspects and advantages of the invention will be even more evident through the following description of an important embodiment of the invention and by referring to the attached drawings, wherein.

DETAILED DESCRIPTION OF PREFERRED EMBODIMENTS

Figure 1:
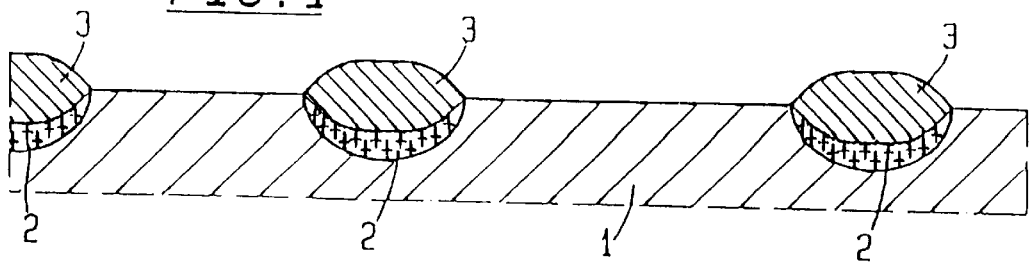
FIGS. 1 to 9 illustrate the significative phases of the process of the invention.

The process of the invention may include, according to a common technique, the steps of forming well regions of a second type of conductivity in a semiconducting substrate of a first type of conductivity. The definition of active areas through a so-called LOCOS process (LOCOS being a trademark of the Dutch company Philips) or a PLANOX (a trademark of the present applicant), which may include an isolation implant of the areas onto which a thick layer of field oxide will be grown, to produce a structure like that shown in FIG. 1, where 1 is the monocrystalline semiconductor of a certain type of conductivity, on the surface of which the active areas of the devices are defined by the isolation diffusions 2 and by the field oxide 3.

According to a widely used technique, during this phase a light implant at high energy may be performed, commonly referred to as antipunch-through (APT). This step is not highlighted in the figures to avoid unnecessary complication. In the case shown, of a p-type conductivity semiconductor 1, which may be a p-well region formed in an n-type conductivity substrate (not shown in the figures) the antipunch-through implant may be an implant of boron ions conducted at 100 KeV, with a dose of approximately $1 \times 10^{12}$. Usually, in this phase of the process, a relatively heavy implant (EPM) is performed in the matrix area, by implanting boron at 120 KeV with a dose of about $6.5 \times 10^{12}$. Differently from the APT implant, this implant is indicated in the figures by the initials EPM.

Figure 2:
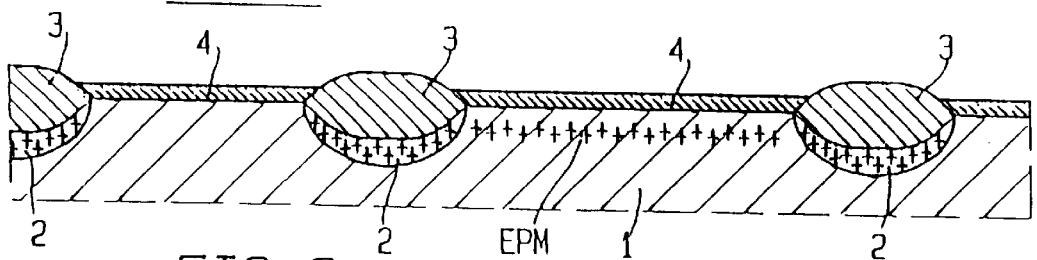
Figure 3:
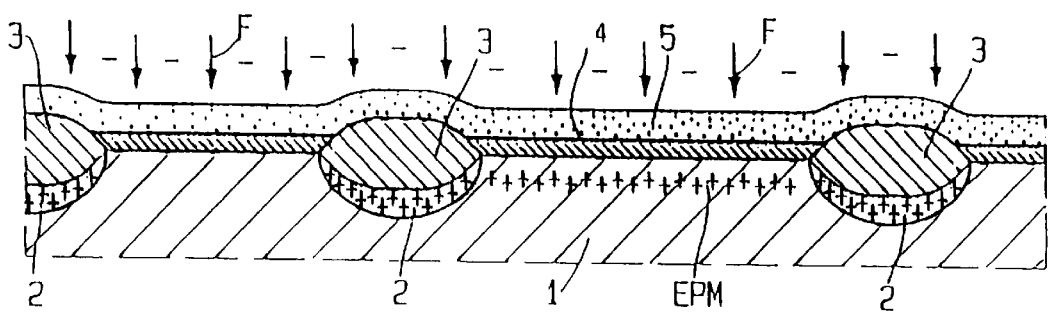
Figure 4:
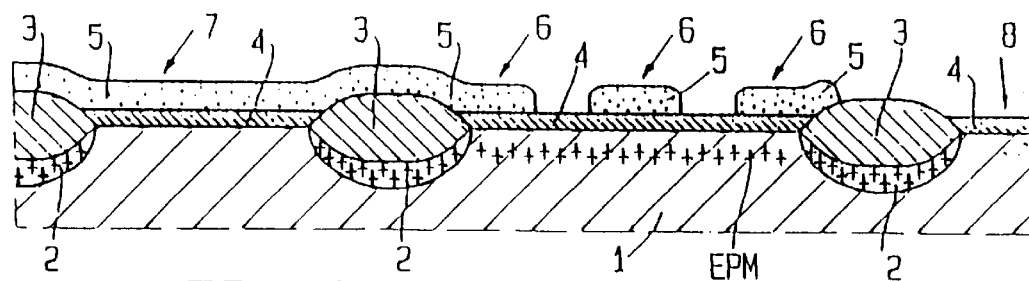

As shown in FIG. 2 and according to a normal sequence of the process, a thin layer of gate oxide 4 is formed over the active areas. The process continues with the deposition of a first polysilicon layer 5, which is adequately doped with phosphorous (F) as shown in FIG. 3. This is followed by a masking and etching (POLY 1) step in order to define the floating gate structures 6 within the matrix area, leaving the polycrystalline silicon of the first level 5 also over the active area 7 of the natural transistors, according to the process described by way of example in the above-mentioned previous Italian application No. 23737 A/84 and as shown in FIG. 4.

Figure 5:
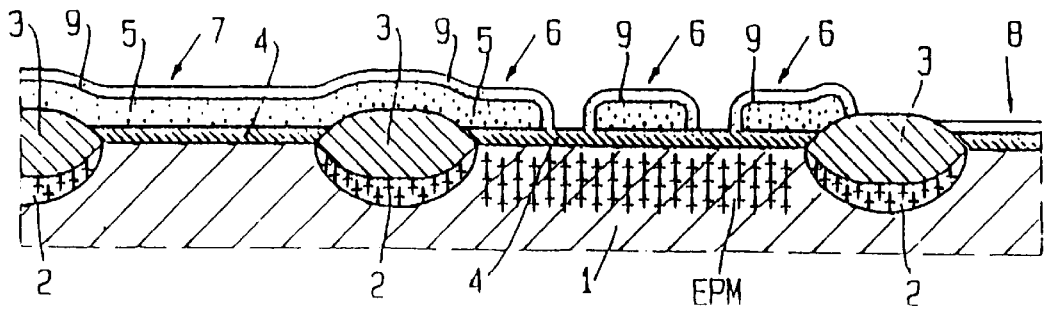

Thereafter an oxidation thermal treatment, which may also be preceded by a deposition of silicon nitride according to a well known technique, is carried out to form an isolating dielectric layer 9, which in the area 8 at the far right side of the figures where it is shown the formation of a direct contact, is superimposed to the existent gate dielectric layer 4. The oxidation thermal treatment determines the diffusion of the dopant implanted in the EPM phase the diffusion is symbolically highlighted in FIG. 5.

Figure 6:
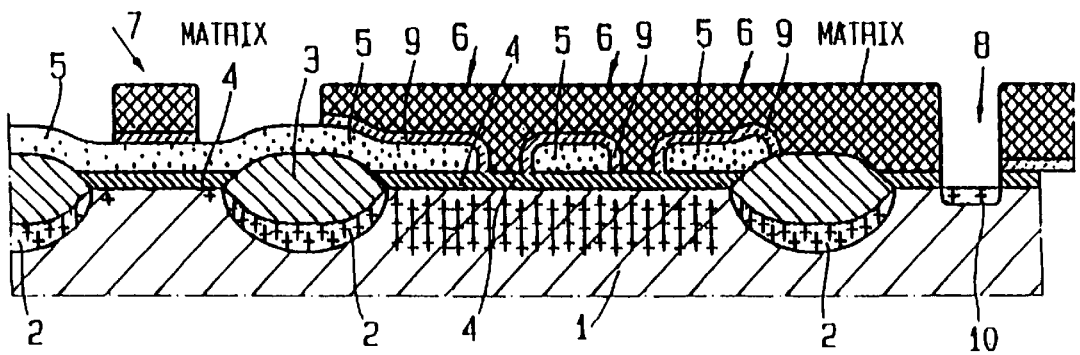

According to the invention and as shown in FIG. 6, the so-called MATRIX mask is formed which, as shown in the left side of the cross sections where it is shown the formation of the natural transistor 7. The MATRIX mask, as modified according to the invention, defines a central or channel area of the transistor.

Figure 7:
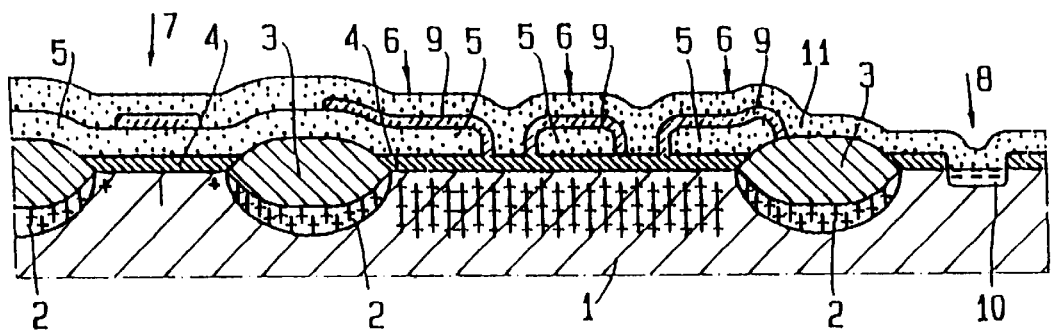
Figure 8:
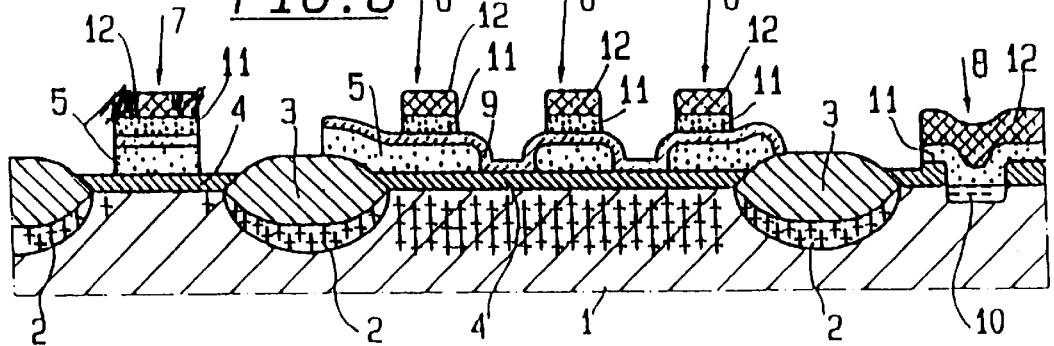

Through the openings of the MATRIX mask the interpoly dielectric layer 9 is etched and eventually a light implant LVS is performed in the channel zone of the transistors of the outer circuitry (not shown in the figures) as well as in the areas of direct contacts 8. In addition, as shown in the cross sections, for the active area of the natural transistor the MATRIX mask shields the channel area of the natural transistor from the LVS implant. After the removal of the MATRIX mask the channel area of the natural transistor is thus covered by the interpoly dielectric layer 9. At this point a layer 11 of polycrystalline silicon of the second level is deposited, as shown in FIG. 7. Thereafter a definition mask 12 of the polycrystalline silicon layer of the second level is formed, as shown in FIG. 8. Over the channel area of the natural transistor this mask 12 has a width substantially smaller than the width of the MATRIX mask that practically defines the channel length of the transistor.

The etching of the polysilicon through the mask 12 (POLY 2) produces, as illustrated in the cross sections of FIG. 8, the definition of the gate structure of the natural transistor, since the dielectric interpoly layer 9 acts as a mask of the selective etching of the polysilicon for the underlying polysilicon of the first level over the channel region of the natural transistor.

Figure 9:
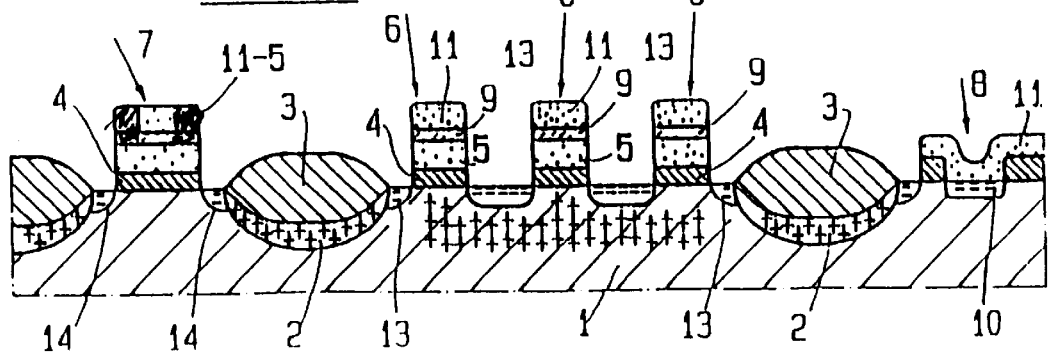

FIG. 9 is a cross section that shows the structure after the removal of the POLY 2 mask 12 and the subsequent implant and diffusion of the source and drain regions of the integrated structures. The patterned layer 11 of polysilicon of the second level in the area of the natural transistor is short circuited with the layer 5 of polysilicon of the first level by direct superposition to the latter over the adjacent field oxide. For this reason, the interpoly dielectric layer 9 that remains between poly 1 and poly 2 above the channel area of the natural transistor has no influence.

Figure 10:
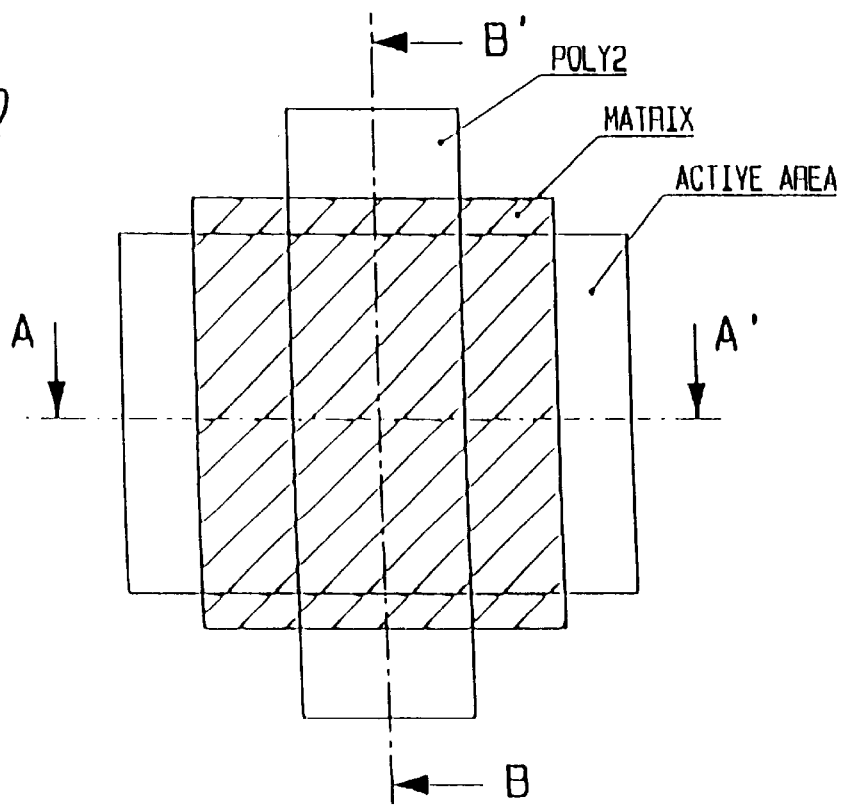
FIG. 10 is a plan view showing the profiles of the three masks by which a natural transistor structure is defined according to the process of the invention.
Figure 11:
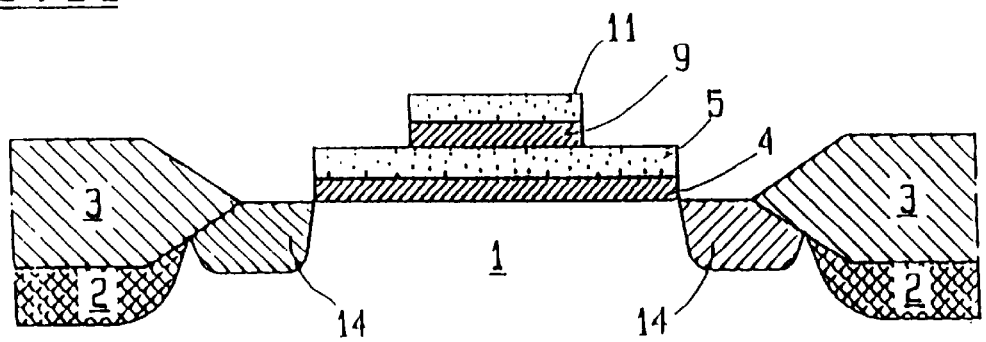
FIG. 11 is a cross section of a natural transistor structure in the section planes identified by the line A–A' of FIG. 10.
Figure 12:
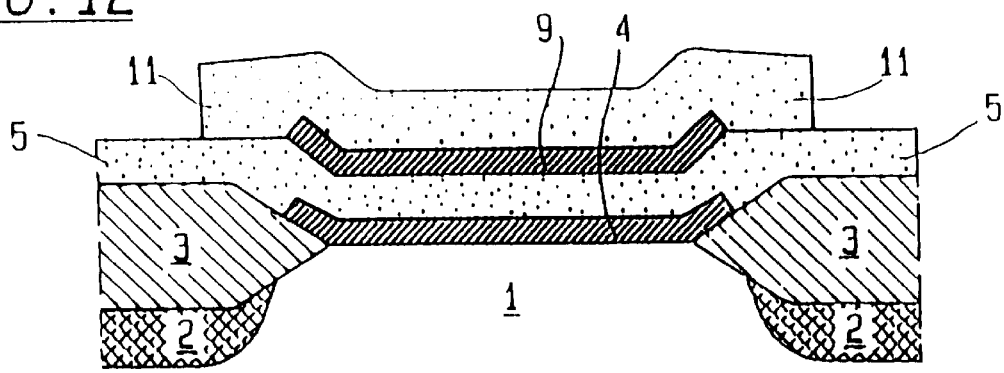
FIG. 12 is a cross section of the natural transistor structure in the section plane B–B' orthogonal to the section plane A—A as indicated in FIG. 10.

The architecture of the natural transistor realized according to the present invention is fully illustrated in FIGS. 10, 11 and 12 that respectively represent a plan view of the relative profiles of the three masks ACTIVE AREA, MATRIX and POLY 2 which define the natural transistor structure according to the present invention and two orthogonal cross sections of the natural transistor structure.

The aim of the invention is thus fully attained. In practice, the invention allows for the realization of natural or low threshold transistors by exploiting the MATRIX mask, suitably modified, to define the channel length of natural transistors, and, thus eliminating the need for an additional masking step as required in the known processes for also realizing the low threshold transistors in addition to the normal enhancement-type transistors for the outer or ancillary circuitry of the memory array.

By way of example, the process of the invention can be performed according to the following characteristics and parameters:

| Implant | Dose | Energy | Type | Variation |
| --- | --- | --- | --- | --- |
| APT | 1E12 | 100 KeV | B | +/−0.5% |
| EPM | 6.5E12 | 120 KeV | B | +/−0.5% |
| LVS | 1E12 | 45 KeV | B | +/−0.5% |
| S/D n+ | 5E12 | 60 KeV | As | +/−1% |
| S/D P+ | 3E12 | 70 KeV | BF2 | +/−1% |

| Layer | Thickness | Variation |
| --- | --- | --- |
| Poly 1 | 1350 Å | +/−225 Å |
| Poly 2 | 2000 Å | +/−200 Å |
| SiW | 2500 Å | +/−250 Å |
| Ox interpoly | 200 Å | +/−20% |
| Ox gate | 190 Å | +/−20% |

I claim:

1. A method of fabricating a natural or low threshold transistor in an integrated circuit further comprising a memory array area of nonvolatile floating gate memory cells including a double level of polysilicon, a gate dielectric layer, and an interpoly dielectric layer of isolation between the two levels of polysilicon, the method comprising the steps of:

a masking step for defining active areas of distinct integrated devices;

a masking step for defining an implant of the memory array area;

a patterning step for polysilicon of a first polysilicon level;

a patterning step using a matrix mask for the interpoly dielectric layer in areas outside the memory array area;

at least another patterning step for polysilicon of at least a second polysilicon level; and defining a channel length of a natural transistor by using the matrix mask used to pattern the interpoly dielectric layer by defining the interpoly dielectric layer also over a channel area of the natural transistor and consequently also over portions of the first polysilicon level not protected by the interpoly dielectric layer during the patterning step for polysilicon of the second polysilicon level.

2. A method according to claim 1, wherein matrix mask portions extending over the channel area of the natural transistor are also exploited for masking the channel area of the natural transistor from an LVS implant of channel areas of enhancement transistors outside the memory array area.

3. A method according to claim 1, wherein the patterning step for polysilicon of the second polysilicon level comprises: patterning the second polysilicon level so as to establish a contact between a portion of the patterned second polysilicon level extending over an area of the natural transistor with the portion of the patterned polysilicon first level that defines a gate of the natural transistor, and over a field oxide layer that defines an active area of the natural transistor.

4. A method according to claim 1, wherein the interpoly dielectric layer is an oxide-nitride-oxide (O.N.O.) multilayer.

5. A method according to claim 1, further comprising the step of defining well regions.

6. A method of fabricating a natural or low threshold transistor in an integrated circuit further comprising a memory array area of nonvolatile floating gate memory cells including a double level of polysilicon, a gate dielectric layer, and an interpoly dielectric layer of isolation between the two levels of polysilicon, the method comprising the steps of:

defining active areas using a field oxide;

depositing and patterning a layer of doped polysilicon of a first polysilicon level to form floating gates of the memory cells;

forming the interpoly dielectric layer of isolation over the patterned portions of the first polysilicon level;

forming a matrix mask over the memory array area to remove the dielectric layer of interpoly isolation outside the memory array area;

defining by means of the matrix mask a channel length of a natural threshold transistor being formed outside the memory array area;

selective etching the interpoly dielectric layer of isolation in areas not masked by the matrix mask;

removing the matrix mask and depositing a layer of doped polysilicon of a second polysilicon level over the entire configuration; and patterning by means of a dedicated mask the polysilicon layer of the second level by selective etching of the polysilicon and continuing the etching through the first polysilicon level in zones of active areas of the natural transistor being formed and not protected by the previously patterned interpoly dielectric layer of isolation, until exposing an underlying gate dielectric layer;

selectively etching the interpoly dielectric layer of isolation and the gate dielectric layer over zones not protected by the patterned polysilicon; and contacting a patterned portion of polysilicon of the first level in the area of the natural transistor by the patterned portion of polysilicon of the second polysilicon level over the field oxide adjacent to the active areas of the natural transistor.

7. A method according to claim 6, further comprising the step of defining well regions.

8. A method according to claim 6, further comprising the step of performing an LVS threshold implant in active areas of enhancement type transistors being formed outside the memory array area and unmasked by the matrix mask.

9. A method according to claim 6, wherein the interpoly dielectric layer is an oxide-nitride-oxide (O.N.O.) multilayer.

* * * * *